(12) United States Patent
Fernandez et al.

(10) Patent No.: US 8,765,359 B2
(45) Date of Patent: Jul. 1, 2014

(54) METHOD OF FABRICATING PATTERNED FUNCTIONAL SUBSTRATES

(75) Inventors: Andres Fernandez, San Francisco, CA (US); Shaunak Roy, Sunnyvale, CA (US); Jay Shafto, Mountain View, CA (US); Norman L. Burns, Sunnyvale, CA (US); Claudia Richter, Sunnyvale, CA (US); Pierre F. Indermuhle, Berkeley, CA (US)

(73) Assignee: Complete Genomics, Inc., Mountain View, CA (US)

( * ) Notice: Subject to any disclaimer, the term of this patent is extended or adjusted under 35 U.S.C. 154(b) by 0 days.

(21) Appl. No.: 13/489,099

(22) Filed: Jun. 5, 2012

(65) Prior Publication Data

US 2013/0323652 A1    Dec. 5, 2013

(51) Int. Cl.
G03F 7/26    (2006.01)
(52) U.S. Cl.
USPC .......................................... 430/315; 430/324
(58) Field of Classification Search
USPC ........................................................ 430/315
See application file for complete search history.

(56) References Cited

U.S. PATENT DOCUMENTS

| | | | |
|---|---|---|---|
| 5,688,642 A * | 11/1997 | Chrisey et al. | 435/6.11 |
| 2006/0252094 A1 * | 11/2006 | Zhou et al. | 435/7.1 |
| 2008/0003694 A1 * | 1/2008 | Swanson et al. | 436/501 |
| 2009/0270273 A1 | 10/2009 | Burns et al. | |

* cited by examiner

*Primary Examiner* — Caleen Sullivan
(74) *Attorney, Agent, or Firm* — Kilpatrick Townsend & Stockton LLP

(57) ABSTRACT

Methods of preparing organosilane-functionalized regions on a substrate surface and more specifically fabricating patterned functionalized substrates suitable to be optically read, the methods generally comprising employing a vapor deposition process of an organosilane gas onto a lithographically patterned silicon surface followed by removal of the patterning media in a bath of organic solvents and ultrasonic excitation. The inventive methods provide optimized surface density of functional species while avoiding deleterious effects that can occur when lithographically patterned substrates are exposed to various gaseous species during the functionalization process.

19 Claims, 10 Drawing Sheets

BELOW MAXIMUM PRESSURE

ABOVE MAXIMUM PRESSURE

BELOW MAXIMUM PRESSURE

ABOVE MAXIMUM PRESSURE

METHOD OF FABRICATING PATTERNED FUNCTIONAL SUBSTRATES

FIELD

The present disclosure relates to methods of preparing organosilane-functionalized regions on a substrate surface.

BACKGROUND

Many applications in biotechnology, medicine, and pharmacology require functionalization of surfaces. Functionalization is the process of terminating a surface with a specific chemical species to produce a desired physical or chemical property at the surface. Many techniques exist for functionalizing a surface including, for example, exposure of the surface to an organosilane. This can be done using a vapor deposition process or a wet chemical process.

Furthermore, there are an increasing number of applications in which it is desirable to only functionalize selective regions of a surface or to functionalize different regions with different chemical species. One such application is the Complete Genomics DNA sequencing process. In this process, polynucleotides such as DNA macromolecules are arranged in a high-density array on a planar substrate and then imaged by four-color fluorescence microscopy. An important element in fabricating the DNA array is producing a surface that is functionalized with one type of chemical species in selected regions and is functionalized with a different chemical species outside the selected regions. More specifically, the selected regions are functionalized so that DNA macromolecules preferentially bind to these regions compared to the rest of the surface. This in turn allows for the self-assembly of arrays of DNA macromolecules when these substrates are exposed to a solution containing such macromolecules.

Devices formed as optically readable-substrates having a high feature density, e.g., attachment or deposition sites, in arrays comprising macromolecules and methods for preparing such devices and for analyzing macromolecules such as nucleic acids using such devices are described in U.S. Publication No. 2009/0270273, which is incorporated by reference herein in its entirety. The surface of the devices contain aminosilane-functionalized regions that are positively charged under certain circumstances and are capable of binding certain macromolecules such as nucleic acids, with other regions of the surface being functionalized with groups that are not able to bind to macromolecules such as nucleic acids. In the substrate fabrication process of U.S. Publication No. 2009/0270273, substrates having a trimethylsilyl monolayer and patterned regions functionalized with an aminosilane are disclosed. It has subsequently been determined that the methods disclosed in U.S. Publication No. 2009/0270273 cannot be extrapolated to produce organosilane-functionalized patterned regions having submicron dimensions as the result of several unexpected phenomena that occur under reaction conditions used to provide highly functionalized surfaces.

Improved methods for providing patterned submicron organosilane-functionalized regions on a substrate are desired.

SUMMARY

According to the invention, methods are provided for fabricating patterned functionalized substrates suitable to be optically read, the methods generally comprising employing a vapor deposition process of an organosilane gas onto a lithographically patterned silicon surface followed by removal of the patterning media in a bath of organic solvents and ultrasonic excitation. The inventive methods provide optimized surface density of functional species while avoiding deleterious effects that can occur when lithographically patterned substrates are exposed to various gaseous species during the functionalization process.

In a first aspect, methods are provided for functionalizing regions of a substrate with an organosilane, wherein the substrate comprises an organic layer and patterned regions of exposed substrate, comprising: exposing the substrate to an organosilane vapor at a pressure below a pressure that causes the organic layer to reflow; and using at least a minimum dose of the organosilane vapor sufficient to provide a useful density of functional groups on the patterned regions.

In a second aspect, methods of method of preparing organosilane-functionalized regions are provided, comprising: providing a substrate having a surface; depositing a resist on the surface; developing selected regions of the resist; etching the developed selected regions of the resist to expose selected regions of the substrate; and depositing a first organosilane onto the exposed regions to provide organosilane-functionalized regions, wherein the depositing is performed using an organosilane vapor at a pressure below a pressure that causes the organic layer to reflow; and using at least a minimum dose of the organosilane vapor sufficient to provide a useful density of functional groups on the patterned regions.

In a third aspect, methods are provided for preparing functionalized regions, comprising: providing a silicon substrate having a surface; oxidizing the surface of the silicon substrate to provide an oxidized silicon surface; functionalizing the oxidized silicon surface with a monolayer of terminal methyl groups; depositing a resist on the methyl-functionalized surface; developing selected regions of the resist, wherein the selected regions have dimensions less than 1 μm; etching the developed selected regions of the resist to expose selected regions of the substrate; and exposing the selected regions to an aminosilane vapor to provide a monolayer having terminal amine groups, wherein the aminosilane vapor has a pressure less than a pressure that causes the organic layer to reflow, and the exposing uses at least a minimum dose of the organosilane vapor sufficient to provide a useful density of terminal amine groups on the selected regions; stabilizing the monolayer having terminal amine groups; and exposing the resist to a non-oxidizing solvent with ultrasonic excitation to strip the resist.

The invention will be better understood by reference to the following detailed description in connection with the accompanying drawings.

DETAILED DESCRIPTION

Figure 1A:
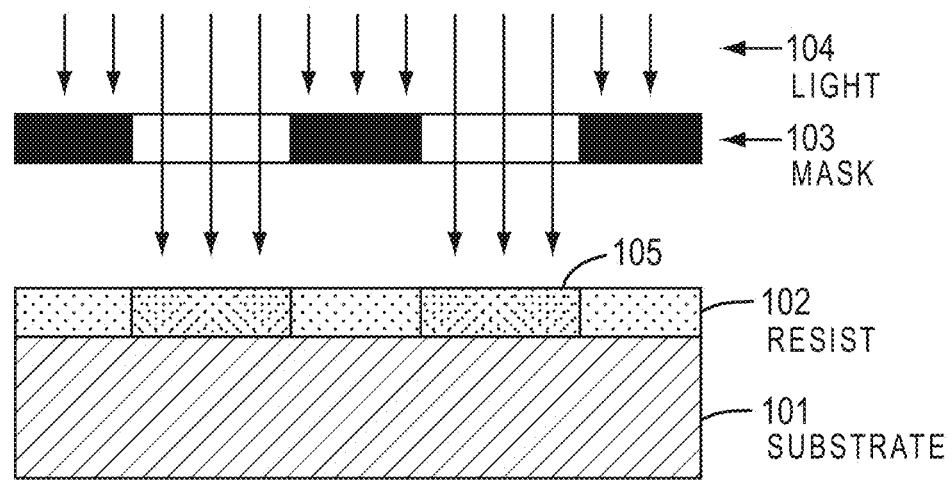
FIG. 1A illustrates the step of photolithographically patterning selected regions for subsequent organosilanization according to certain embodiments.

Reference is now made to certain embodiments of methods and devices. The disclosed embodiments are not intended to be limiting of the claims. To the contrary, the claims are intended to cover all alternatives, modifications, and equivalents.

Certain embodiments of the invention disclosed by the present disclosure include methods for fabricating substrates having patterned organosilane-functionalized regions with submicron dimensions. In certain embodiments, the organosilane-functionalized regions comprise aminosilane-functionalized regions capable of binding macromolecules such as nucleic acids. The organosilane-functionalized or aminosilane-functionalized areas may be further modified or adapted to provide other useful capabilities. For example, aminosilane-functionality may be chemically reacted to provide other chemical properties useful in high-throughput screening applications.

Certain device fabrication processes provided by the present disclosure include, for example, (1) oxidizing a substrate, (2) depositing an organosilane layer, (3) patterning the substrate, (4) etching the exposed regions, (5) functionalizing the patterned regions with an organosilane, (6) stabilizing organosilane bonding to the substrate surface, (7) coating with a protective coating, (8) dicing the substrate, and (9) stripping the resist. In certain embodiments of a process as disclosed herein, whether some or all of these steps are to be performed depends at least in part on the materials used and the intended use of the devices fabricated using the process.

The substrate used for functionalization comprises a base with a coated surface that is subsequently developed to define a selected pattern of discrete, exposed regions on the substrate where it is desired to add chemically active species. The exposed areas on the substrate are then functionalized to add the desired functional groups to the exposed areas, and the resist removed to provide a substrate with a defined pattern of chemically active species.

A substrate for use in the disclosed methods may comprise any material such as, for example, silicon, glass, quartz, a Group IV semiconductor, a metal, an alloy, a polymer or combination of any of the foregoing. A substrate may be planar, non-planar, or a combination thereof.

In certain embodiments, a substrate may be used without surface treatment. However, in certain embodiments, and in particular in embodiments where it is desirable to impart a desired functionality to non-patterned regions of a substrate surface, the substrate surface may first be oxidized. Silicon surfaces may be readily oxidized. In certain embodiments, an oxidized silicon surface is used for silanization because of its propensity to become hydroxylated, e.g., terminated with —OH groups. An oxidized silicon substrate may be produced, for example, by thermal oxidation of silicon in oxygen ($O_2$) or in water vapor or by deposition using chemical vapor deposition (CVD).

An oxidized silicon surface may be organosilanized by exposing the surface to an organosilane compound either in the vapor state or in the liquid state. Any suitable organosilane may be used that is reactive with surface hydroxyl groups and that has a desired chemical functionality. The selection of an organosilane will depend, at least in part, on the desired chemical functionality for a particular intended use. In certain embodiments, an organosilane vapor is selected from hexamethyldisilazane (HMDS), hexaethyldisilazane, hexapropyldisilazane, and combinations of any of the foregoing. In certain embodiments, the organosilane is HMDS. Surface functionalization with HMDS provides a surface terminated with methyl groups (—$CH_3$), which, under certain conditions of pH and surfactant concentrations, have the desirable chemical property that oligonucleotides such as DNA do not have an intrinsic attraction to the moiety, and also because an HMDS-functionalized surface can serve as a good adhesion promoter for a resist as applied in a subsequent step. In certain embodiments, the organosilane film is substantially a single molecular layer, e.g., a monolayer. In certain embodiment, the deposition temperature may be from about 125° C. to about 175° C., or other suitable elevated temperature.

Alternatively, for intended uses where functionalization of the non-patterned portion of the substrate surface is not desired, the substrate surface is not functionalized.

In the next step, the organosilane functionalized substrate is patterned to define discrete or selected regions to be functionalized with a chemical species. Patterning may be accomplished using, for example, photolithography or electron beam lithography using methods well known in the art. In such methods, a resist is first deposited on the substrate surface which may comprise an organosilanized surface. The resist may comprise any suitable organic resist and may be applied using methods known in the art such as, for example, by spin coating the organic resist onto the substrate surface. The resist may be a positive or a negative resist. Following deposition, the resist may then be patterned using standard lithographic methods using, for example, optical projection lithography with i-line or deep ultraviolet (UV) radiation, or other method capable of producing submicron features. For example, the resist film may be exposed to radiation, such as light in the case of photolithography or high-energy electrons in the case of electron beam lithography. The exposure occurs in a designed pattern determined, for example, by a mask in photolithography. Other patterning processes such as nanoimprint lithography or extended ultraviolet lithography (EUV) may also be employed. The process is illustrated in FIG. 1A, which shows selective regions 105 of a resist 102 disposed on substrate 101 being irradiated by radiation source 104 through a photolithography mask 103. Suitable patterning techniques have the ability to produce structures less than 1 μm and in certain embodiments, as small as 50 nm and with pitches as small as 100 nm. In certain embodiments, patterned features having a maximum dimension less than about 1 μm, less than about 750 nm, less than about 500 nm, less than about 250 nm, less than about 200 nm, and in certain embodiments, less than about 100 nm are produced. In certain of such embodiments, the patterned features form an array having a pitch about twice the maximum feature dimension.

Figure 1B:
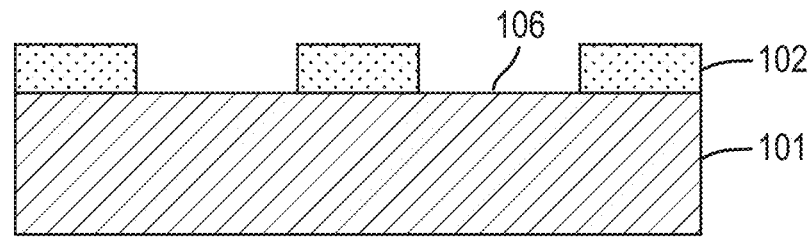
FIG. 1B shows a patterned substrate surface after resist development according to certain embodiments.

During the development step the resist is removed (or in the case of a negative resist, the unexposed regions are removed) to expose selected regions of the substrate surface in preparation for functionalization with a second chemical functionality. FIG. 1B shows patterned regions 106 of exposed substrate 101 and regions of undeveloped resist 102 overlying substrate 101.

After the pattern in the resist is formed, there is generally a residue of organic material at the base of the open regions. The organosilane layer may also be present. Both of these materials can be removed before a second organosilane deposition can be done. Any suitable process may be used to remove these materials including, for example, dry etching methods such as plasma etching, reactive ion etching (RIE), and ion milling, or wet etching methods. The parameters of the etching process are selected to remove any residual resist, to remove the organosilane monolayer (if present) in the patterned regions, to generate silanol functionality on the substrate surface of the patterned regions, and/or to minimize removal of the unexposed regions of the resist.

For example, in certain embodiments a substrate coated with the developed resist may be exposed to an oxygen plasma, which removes any resist residue left over from the lithography process and etches an organosilane layer if one is present. Plasma generation can be a direct process such as in a reactive ion etching tool or an indirect process such as in a downstream plasma tool. Other etchant gases such as $CHF_3$ or $SiF_6$ may be used, which may etch into the oxide layer as well. In certain embodiments where the substrate is silicon, it is desired that an etching process, such as a plasma etching process, be used to promote the disruption of relatively inert siloxane bonds (O—Si—O) to form more reactive silanol groups (—SiOH) on the substrate surface. Silanol groups are specific sites where organosilanes can react with the surface. A greater density of these sites is desired for effective and/or optimal functionalization.

During the etching process, it is desirable that only a small amount of the resist film is removed such that the thickness of the resist structure is substantially unchanged and the lateral dimensions of the structures are unchanged. For example, in certain embodiments, oxygen plasma etching results in the removal from about 5 nm to about 20 nm of the regions of the resist that were not patterned.

Figure 2A:
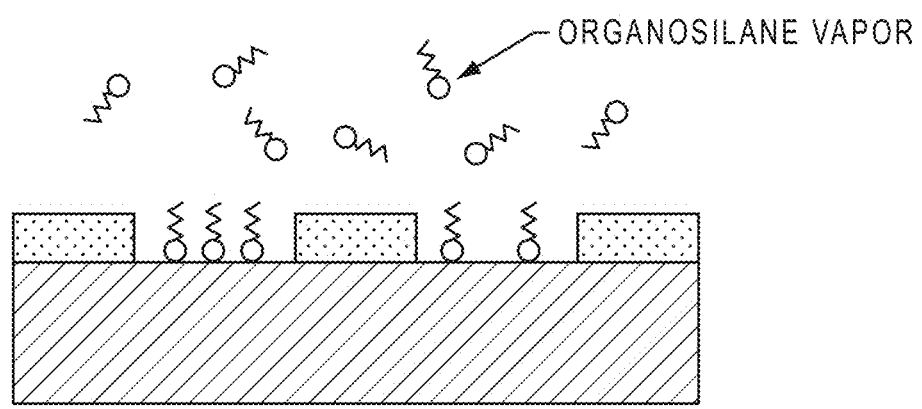
FIG. 2A illustrates the process of organosilanization of selected regions of a substrate according to certain embodiments.

The next step in the fabrication process is to functionalize the exposed regions. This may be performed using a chemical vapor deposition (CVD) process. As an example of the process, substrates are loaded into a vacuum chamber that is pumped to a base pressure of $P_b$. After reaching the base pressure, the chamber is opened to a source of organosilane vapor and is filled to a prescribed deposition pressure of $P_d$. The difference between $P_d$ and $P_b$ is the partial pressure of the source gas $P_s$ during deposition. The substrates are exposed to this vapor for a period of time t. During this time period, the organosilane molecules that reach the surface of the exposed regions can react with the surface to generate a functional group attached to the surface as depicted in FIG. 2A. In general, the reaction is a self-limiting process that leaves a full monolayer of functional groups on the surface. Once deposition is complete, the source vapor is pumped out of the system and the system is vented to air.

The deposition process may be performed statically whereby the chamber is filled with the organosilane vapor without active pumping of the chamber. Thus, a fixed amount of organosilane vapor can be used for the deposition. Alternatively, the organosilane can be introduced into the chamber while the chamber is being actively pumped. In this type of process, an inert carrier gas such as $N_2$ may be used to inject the organosilane vapor into the reaction chamber.

The process window for optimal functionalization of a substrate surface is at least in part determined by the dosage of the functionalization source, the nature of the interaction between the resist material and the functionalization source, and controlled variables such as temperature, pressure, etc.

Process variables include the vacuum base pressure $P_b$, the reaction temperature T, the pressure of the source gas $P_s$, which is equal to $(P_d-P_b)$, and the deposition time t. Another useful parameter is the deposition dose D, which is defined as the number of functionalized gas molecules that impinge on a surface per unit area during the deposition. To within a good approximation, the dose D is equal to the following (Equation 1):

$$D = \frac{P_s t}{\sqrt{2\pi m k T}} \quad (1)$$

where m is the molecular weight of the deposition gas, and k is the Boltzmann constant.

Not all values within the range of the process variables listed above result in a functionalized substrate with desirable surface properties. For example, if the dose D is too low, the surface will not become sufficiently functionalized to create a saturated monolayer or a density of surface functionality useful for a particular application. Insufficient surface functionality may result in a surface that is not able to or is not optimized to perform its intended function such as, for example, capable of capturing DNA macromolecules. The extent of surface functionality is reflected by the surface density of desired functional groups. The lower limit of an acceptable organosilane dose may be determined empirically by varying the source pressure $P_s$ at a fixed temperature and deposition time until a saturated monolayer or acceptable density of functional groups is achieved. In the temperature range from about 20° C. to about 75° C., a saturated layer of aminopropyltrimethoxysilane (APTMS) or aminopropyltriethoxysilane (APTES) on silicon oxide is achieved at a pressure of about 10 mTorr and a deposition time of about 15 min. This corresponds to a deposition dose of about $1\times10^{25}/m^2$. Thus, in certain embodiments, a minimum deposition dose is at least about $1\times10^{24}/m^2$, at least about $5\times10^{24}/m^2$, at least about $1\times10^{25}/m^2$, at least about $5\times10^{25}/m^2$, and in certain embodiments, at least about $1\times10^{26}/m^2$.

From Equation (1), it can be inferred that a lower limit on the organosilane dose imposes a lower limit on the product of the source pressure and the deposition time $P_s \times t$. For example, if the pressure is decreased below 10 mTorr, the deposition time can be increased to compensate so that the dose remains above a desired minimum value. In a plot of pressure versus time, this relation marks a boundary below which the process yields reduced surface functionality. The boundary is defined as the minimum dose curve. Although dose Equation (1) indicates that the minimum dose boundary also depends on temperature and molecular mass, for a practical temperature range from about 20° C. to about 75° C. and molecular weights of the deposition species between 160 and 222 atomic mass units, the minimum dose boundary only shifts about +/−10% from a nominal curve in the pressure-time domain.

Figure 3A:
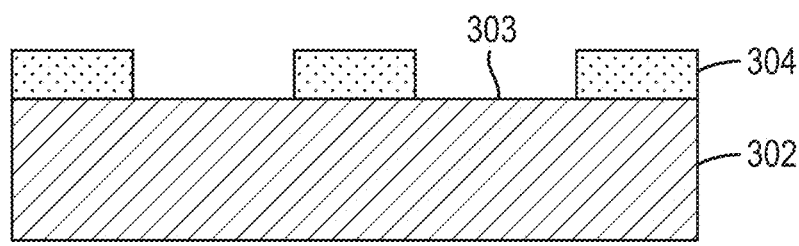
FIG. 3A shows a schematic of a patterned substrate following organosilanization within the process window according to certain embodiments.
Figure 3B:
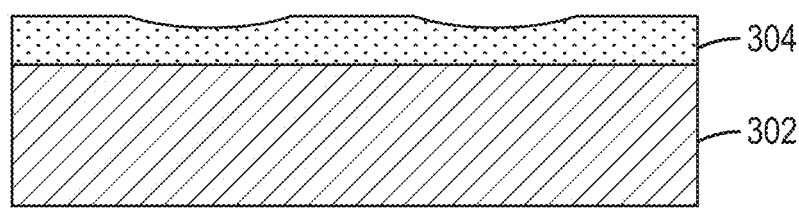
FIG. 3B shows a schematic of a patterned substrate following organosilanization outside the process window according to certain embodiments.

Another important consideration for adequate surface functionalization is the maximum pressure of the organosilane vapor. From dose Equation (1), it can be surmised that at higher pressures the deposition time can be reduced. Thus, operating at high pressures can increase process throughput, thereby reducing operating costs. However, at high organosilane pressures, organic films such as photoresists and electron-beam resists can interact with the organosilane vapor and/or with the by-products of the organosilane reactive groups such as alcohols (i.e. methanol or ethanol in the case of methoxy and ethoxy groups, respectively). These interactions can result in a phase transition of the patterned organic film from a solid to a liquid state. This effect is referred to as reflow and results in the liquefied organic film flowing into and potentially obscuring the patterned features as illustrated in FIG. 3A and FIG. 3B. FIG. 3A shows an example of a substrate after organosilanization under conditions that do not cause reflow such that the integrity of the organosilanized patterned regions 303 of substrate 302 and the undeveloped resist 304 are maintained. FIG. 3B illustrates the effect of organosilanization under conditions that cause the resist to reflow such that the liquefied resist 304 flows into and partially fills the patterned regions. Reflow is well-known to occur in photoresists at temperatures approaching 130° C., but what is surprising is that reflow occurs well below 100° C. during organosilanization in the presence of a high concentration (e.g., high pressure) of organosilane vapor such as APTES and APTMS.

As discussed herein, for functionalizing a surface with APTMS, the maximum pressure to avoid reflow is about 200 mT. Thus, in certain embodiments, the pressure during the organosilanization process is less than about 200 mT, less than about 100 mT, less than about 50 mT, less than about 10 mT, less than about 5 mT, and in certain embodiments, less than about 1 mT. Also as discussed herein, methods are disclosed for determining the maximum pressure to avoid reflow using APTMS as well as other organosilanes.

Figure 4:
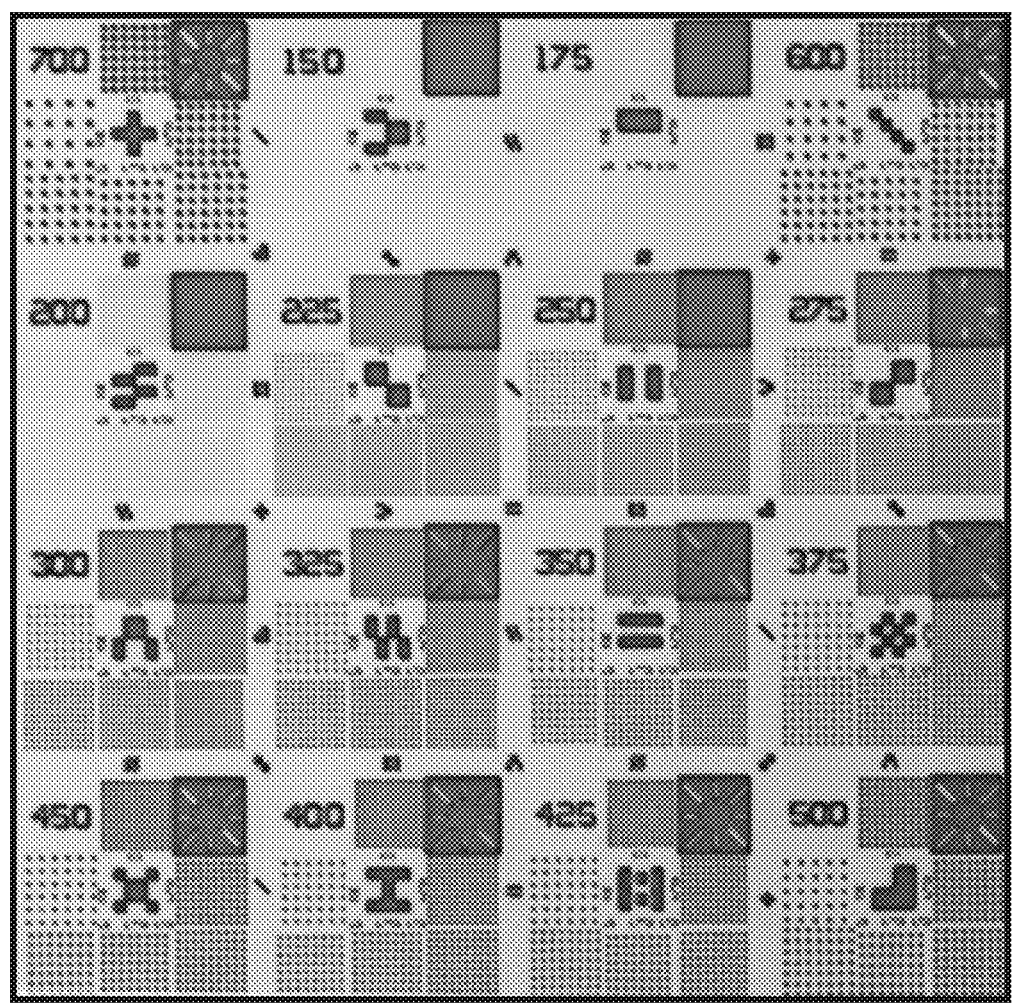
FIG. 4 shows an optical micrograph depicting a silicon test wafer having different dimensions of patterned organosilanized regions in which the organosilanization reaction was performed within the process window.
Figure 5:
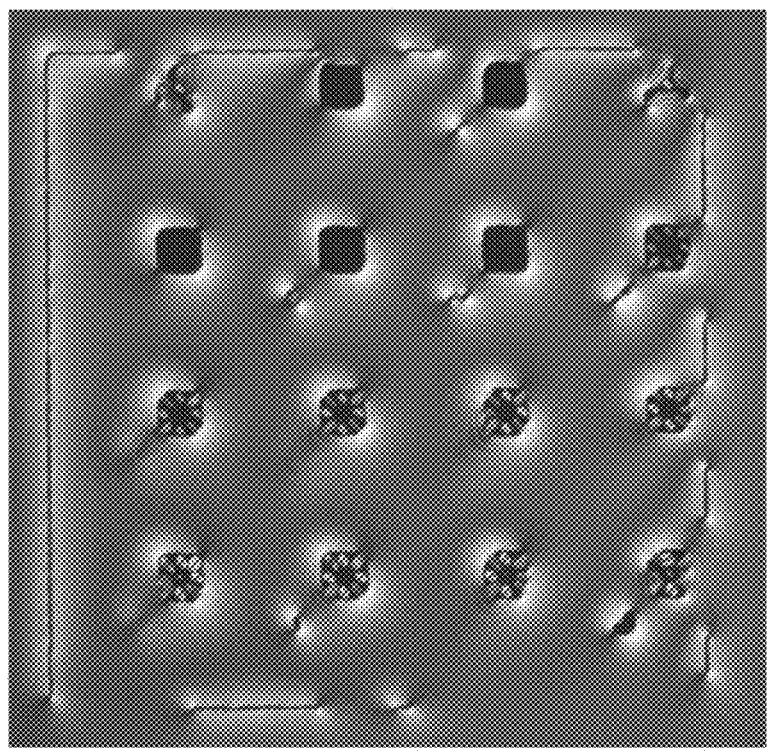
FIG. 5 shows an optical micrograph depicting a silicon test wafer having different dimensions of patterned organosilanized regions in which the organosilanization reaction was performed outside the process window.

FIG. 4 shows a microscope image of a resist patterned substrate after exposure to an organosilane vapor (APTES) at a pressure below that which results in reflow. As can be seen in FIG. 4, the features, which are as small as 200 nm (the smallest features resolved in this particular lithography step) are preserved. FIG. 5 shows an image of a similar substrate after exposure to an organosilane vapor above the maximum APTES pressure. As is evident in FIG. 5 the patterned features are almost completely filled in except for very large features, e.g., features having dimensions greater than 10 μm. In addition to the obvious morphological changes caused by reflow, the change in state of the resist to a liquid can result in rapid diffusion of the organosilane vapor into the resist. When this occurs, surfaces underneath the resist can react with the diffused organosilane and thereby become functionalized, which compromises the goal of selective functionalization. It can be appreciated that different organosilanes may have different mechanisms for causing reflow and/or exhibit different relative contributions by the various mechanisms.

In certain embodiments, a dose of an organosilane such as an aminosilane including APTES or APTMS, to which the surface is exposed is at least about 150 mT-min, at least about 300 mT-min, at least about 600 mT-min, and in certain embodiments, at least about 1,000 mT-min, where the dose in units of mT-min refers to the product of the pressure during deposition and the time of the organosilanization process.

Figure 6:
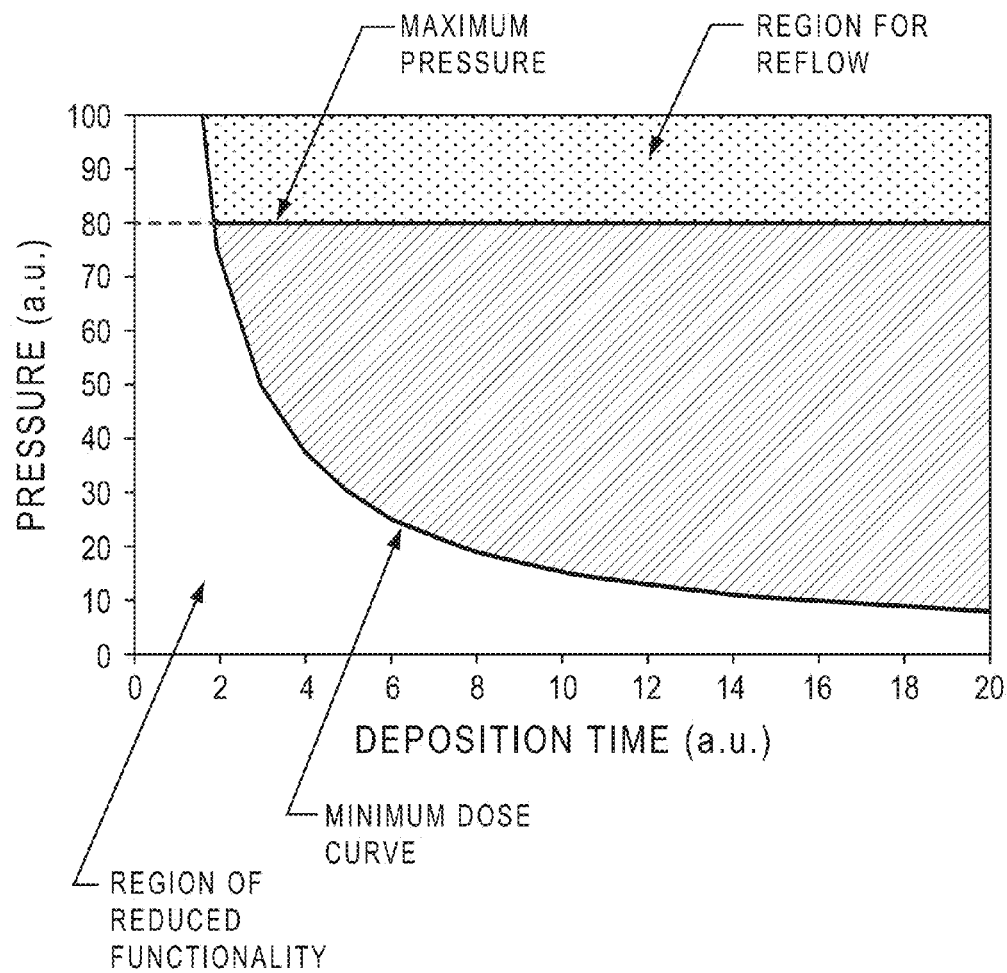
FIG. 6 shows a graph illustrating the organosilanization process window defined in terms of arbitrary units (a.u.) of pressure and deposition time according to certain embodiments.

The combination of a minimum dose and a maximum pressure creates a range of operating pressures and times or process window for which the selective functionalization process yields substrates with desired characteristics. These ranges are illustrated in FIG. 6 where the minimum dose curve and maximum pressure are indicated on a plot of organosilane pressure vs. deposition time. The axes are in arbitrary units (a.u.) for illustrative purposes. However, a detailed process for determining quantitative values of the operation range for specific organosilanes is disclosed herein.

Figure 2B:
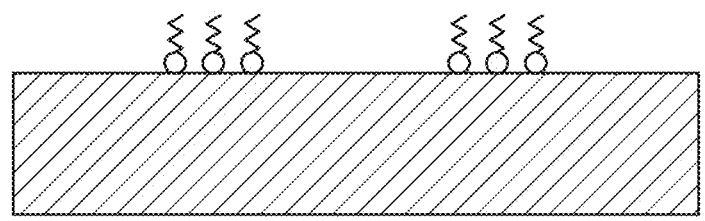
FIG. 2B shows selected organosilanized regions of a substrate following resist removal according to certain embodiments.

The organosilanization process can generally be applied to any organosilane gas capable of reacting with a surface have reactive silanol groups such as a silicon oxide surface. In certain embodiments, an organosilane contains an amino-functional group such as, for example, aminopropyldimethylethoxysilane (APDMES), aminopropyltrimethoxysilane (APTMS), aminopropyltriethoxysilane (APTES), N-(2-aminoethyl)-3-aminopropyltrimethoxysilane, and combinations of any of the foregoing. In certain embodiments, an amino-organosilane is APTMS, in certain embodiments, APDMS, and in certain embodiments APTES. In certain embodiments, an amino-organosilane vapor comprises an aminoalkyl(trialkoxy)silane. In certain embodiments, an aminoalkyl(trialkoxy)silane has the structure $NH_2-R^1-Si(-OR^2)_3$ where $R^1$ is $C_{1-6}$ alkanediyl and $R^2$ is $C_{1-4}$ alkyl. In certain embodiments, $R^1$ is $C_{1-4}$ alkane-diyl, $C_{1-3}$ alkane-diyl, and in certain embodiments $C_{1-2}$ alkane-diyl. In certain embodiments, $R^1$ is selected from methane-diyl, ethane-diyl, propane-diyl, butane-diyl, pentane-diyl, and in certain embodiments, hexane-diyl. In certain embodiments, $R^2$ is selected from $C_{1-3}$ alkyl, and in certain embodiments, $C_{1-2}$ alkyl. In certain embodiments, $R^2$ is selected from methyl, ethyl, propyl, and in certain embodiments, butyl. As illustrated in FIG. 2B, aminosilanes can react with surface silanol groups to form patterned functionalized regions having terminal amine groups. Surfaces terminated with amino-functional groups can, under certain pH conditions, produce a positively charged surface in an aqueous solution. When positively charged, such regions form an attractive force to polynucleotides such as DNA, which is generally negatively charged in solution. This attraction provides a means of forming regular arrays of DNA macromolecules through a self-assembly process as disclosed in U.S. Publication No. 2009/0270273.

Other organosilanes may also be used to provide patterned regions having a desired surface functionality. In general, organosilanes refer to organic compounds containing carbon-silicon bonds, having a basic structure of $R_nSi(-OR)_{4-n}$, where each R is independently selected from $C_{1-6}$ alkyl, and R is selected from $C_{1-6}$ alkyl, phenyl, and an organofunctional group. Organosilanes include, for example, aminosilanes, vinyl silanes, epoxysilanes, methacrylsilanes, alkylsilanes, phenylsilanes, and chlorosilanes. Aminosilanes, such as aminopropyldimethylethoxysilane (APDMES), can act as adhesion promoters, coupling agents and/or resin additives with the ability to improve chemical bonding of resins to inorganic fillers and reinforcing materials. Aminosilanes also can be used to create surfaces for binding of certain biological molecules including nucleic acids such as DNA or RNA. Aminosilanes are also used for further binding of epoxies, phenolics, melamines, nylons, PVC, acrylics, polyolefins, polyurethanes, and nitrile rubbers.

Vinylsilanes are coupling agents and/or crosslinking agents and can be used for addition of sulfur and peroxide cured rubbers, polyesters, polyolefins, styrenics, and acrylics. They can also be used to copolymerize with ethylene for moisture-induced coupling of polyethylene, and to graft to polyethylene for moisture-induced coupling.

Epoxysilanes are generally used as adhesion promoters for epoxies, urethanes, and acrylics.

Methacrylate-silanes are adhesion promoters and/or coupling agents, generally used for addition of free-radical, crosslinked polyester, rubber, poly(olefins), styrenics, and acrylics. They can also be used to couple fillers or fiberglass to resins, and for moisture crosslinking of acrylics.

Alkylsilanes can be used for hydrophobic surface treatment of fillers and inorganic surfaces, including promotion of silicone synthesis.

Phenylsilanes provide a hydrophobic surface treatment and can be used as a hydrophobic additive to other silane coupling agents. They also provide thermal stability as an additive to other silanes, and can be used in the synthesis of silanes and siloxanes Chlorosilanes are a group of reactive, chlorine-containing chemical compounds used in many chemical processes having at least one silicon-chlorine bond. $R_nH_mSiCl_{4-n}$-m is the basic structure of chlorosilane with R being an alkyl, aryl, or olefinic group. They are conventionally used in the synthesis of silanes and siloxanes and as protecting agents for specific chemical groups. Examples of suitable chlorosilanes include dimethyldichlorosilane, methyldichlorosilane, methyltrichlorosilane, phenyltrichlorosilane, trichlorosilane, trimethylchlorosilane, silicon tetrachloride, and vinyltrichlorosilane.

In certain embodiments, an organosilane used in methods provided by the present disclosure provides coupling groups for further modification of the substrate. Such functionalization sources include, for example, glycidoxypropyltrimethoxysilane ($CH_2(O)CHCH_2OC_3H_6$—$Si(OCH_3)_3$)), aminoethylaminopropyltrimethoxysilane ($H_2C_2H_4NHC_3H_6$—$Si(OCH_3)_3$), glycidoxypropylmethyldiethoxysilane ($CH_2(O)H_2OC_3H_6$—$Si(CH_3)(OC_2H_5)_2$) aminopropyltriethoxysilane ($H_2NC_3H_6$—$Si(OC_2H_5)_3$), and aminopropyldimethylethoxysilane ($H_2NC_3H_6$—$Si(OCH_3)_2$), each of which are coupling agents for many thermoset resins with glass or mineral fillers; ammonium functional alkoxysilanes, which provide antistatic properties; methacryloxypropyltrimethoxysilane ($H_2C$=$CH(CH_3)C(O)OC_3H_6$—$Si(OCH_3)_3$) which is a coupling agent for unsaturated resin systems; vinylbenzylaminoethylaminopropyltrimethoxysilane ($C_6H_4$—$CH_2$—$NHC_2H_4NHC_3H_6$—$Si(OCH_3)_3$) and mercaptopropyltrimethoxysilane ($HS(CH_2)_3Si(OMe)_3$), both of which are low chloride coupling agents for many resin systems; vinyl triacetoxy silanes, which are adhesion promoters for polyester, polyolefin, styrene and acrylic substrates; chloropropyltrimethoxysilane ($ClC_3H_6$—$Si(OCH_3)$) which is a coupling agent and chemical reactant for making other methoxysilanes; glycidoxypropyltrimethoxysilane mixed with a melamine resin, which is a general purpose coupling agent for thermoset resins; phenyltrimethoxysilane ($C_6H_5$—$Si(OCH_3)_3$), which is generally used for adhesion of phenolic and epoxy resins; aminoethylaminopropylsilane triol homopolymer ($H_2C_2H_4NHC_3H_6$—$Si(OH)_3$) which is a methanol-free adhesion promoter; vinyl tris(methoxyethoxy) silane ($H_2C$=$CH$—$Si$—$(OC_2H_4OCH_3)_3$), vinyltrimethoxysilane ($H_2C$=$CH$—$Si(OCH_3)_3$), and vinyltriethoxysilane ($H_2C$=$CH$—$Si(OC_2H_5)_3$) each of which is a coupling agent for mineral filled rubber and/or crosslinking agents; chloropropyltriethoxysilane, which improves chemical bonding of resins to inorganic materials; tetraethoxysilane ($Si(OC_2H_5)_4$), which is a diluent for zinc-rich primers and an additive for other coupling agents; methyldimethoxysilane ($CH_3Si(H)(OCH_3)_2$), which is reactive in hydrosilation to form ethoxysilyl functional materials; bis-triethoxysilylpropyldisulfidosilane and bis-triethoxysilylpropyltetrasulfidosilane, which are coupling agents for silica-filled rubber; and phenyltriethoxysilane ($C_6H_5$—$Si(OC_2H_5)_3$), which is a hydrophobic agent and high temperature additive for other coupling agents.

In certain embodiments, an organosilane can be useful in protecting reactive sites to allow other sites to be selectively reacted. Such organosilanes include, for example, tert-butyldimethylchlorosilane, tert-butyldimethylchlorosilane in ethyl acetate, and tert-butyldimethylchlorosilane in toluene.

In certain embodiments, an organosilane may be useful in biotechnology applications to protect various carboxy, amino, and hydroxyl groups on the substrate surface, or to create hydrophobic areas for further functionalization of the substrate. Oganosilanes useful in protection of various chemical groups include, for example, trimethylchlorosilane, hexamethyldisilazane, and tert-butyldimethylchlorosilane.

In certain embodiments, an organosilane can be useful to produce hydrophobic areas of the substrate, such as hexamethyldisilazane, which is especially applicable in pharmaceutical processing operations.

In certain embodiments, it is desirable to further functionalize the patterned regions of the substrate. For example, substrates having patterned regions functionalized with organosilanes that are coupling agents may be further functionalized to provide a second functionalized coating, such as a crosslinker, a resin, an inorganic material, rubber, etc. In other examples, the second functionalization provides a surface with patterned active sites, such as amine groups, in the desired locations on the substrates.

After functionalizing selected regions with an organosilane, a substrate may be removed from the CVD chamber and, in certain embodiments, may be stored for a predetermined time at a certain temperature. For example, in certain embodiments, the selectively organosilanized substrate can be stored at room temperature and in normal room air (i.e., not desiccated) for a period of at least about 8 hours before further processing. The waiting period provides an opportunity for the newly deposited organosilane molecules to form stable bonds to the silicon oxide surface and/or to nearest neighbor organosilane molecules thereby forming a crosslinked layer. This step stabilizes the organosilane layer so as to prevent degradation during subsequent processing steps, which involve subjecting the substrate and functionalized surfaces to organic solvents that could erode the delicate functionalized surface.

Although the stabilization step may be performed at room temperature, the process may be accelerated by baking the substrate at an elevated temperature such as, for example, at about 120° C. The post-bake may be done in air or in a vacuum oven depending on whether other constituents in air such as CO, $CO_2$, or hydrocarbons counteract the benefits of baking by accelerating longer-term degradation mechanisms. However, in certain embodiments, stabilization is facilitated in the presence of moisture.

After stabilization, the subsequent substrate processing steps can be selected depending on the intended use of the fabricated devices. For example, two potential pathways depend on whether a substrate needs to be diced or not. In many applications, a substrate will need to be diced into smaller usable die. This is very typical in many semiconductor applications where individual chip sizes are much smaller than substrate sizes. On the other hand, there are certain applications in which the substrate size and shape match the end use. In the latter case, the resist may be stripped from the substrate without further processing. In cases that require dicing, an additional processing step is generally useful.

Dicing substrates can be performed using a diamond saw with a stream of liquid such as deionized water as a lubricant. As cuts are made, a stream of liquid filled with substrate particles comes into contact with the substrate, which may cause damage to the organosilane layer deposited in the patterned regions. To protect the organosilane layer during dicing, substrates can be coated with a protective film. Examples of suitable materials for a protective film include resists used in lithography. For example, a convenient process is to spin on a film of Novolac-based photoresist to a thickness of about 1 μm. This protective film is spun on top of the original lithographically patterned resist as well as on the selectively organosilanized regions, and as a result some intermixing of the two resists can occur. In certain embodiments in which the dicing process is completely dry, such as with a laser-based dicing process, a protective coating may or may not be applied prior to dicing.

Stripping the lithographically patterned resist film and protective coating, if present, is the next step in the fabrication process. The objective of this step is to remove the bulk organic films (original patterned film plus added protective coating if applied) to expose the functionalized substrate surface, which comprises regions having different chemical groups in pre-determined patterns. Stripping bulk organic films such as resists can be accomplished using a plasma etching process. However, a plasma etching process cannot be used for this application because the plasma could etch or damage the underlying organosilane layers. Although strong acids or bases may also be used to remove the bulk organic film, these caustic chemicals can similarly etch the underlying layers.

In certain embodiments provided by the present disclosure, the protective coating and resist layer may be removed by exposure to a non-oxidizing organic solvent in the presence of ultrasonic excitation. Examples of suitable non-oxidizing solvents include, for example, n-methyl-2-pyrrolidone (NMP), ethyl lactate, propylene glycol methyl ether acetate (PGMEA), and combinations of any of the foregoing.

Although there are many variations of solvent-based processes that can selectively strip the bulk organic layers without affecting the underlying functionalized surfaces, a specific embodiment is described by the following series of steps. A substrate is first placed in a bath of 90% NMP/10% pyridine for about 10 min with ultrasonic excitation. The bath temperature can be, for example, from about room temperature to about 60° C. During the about 10 minutes in the bath, the substrates are moved and/or rotated within the tank. The substrate is then placed in a second bath of the same chemical for about 10 min with ultrasonic excitation. Movement and/or rotation of the substrate may also be performed while the substrate is in the second bath. Next, the substrate is placed in a bath of isopropyl alcohol for a few minutes, again with ultrasonic excitation. The last step is to rinse the substrates thoroughly in deionized water, followed by drying, for example, in a flow of $N_2$.

Figure 7A:
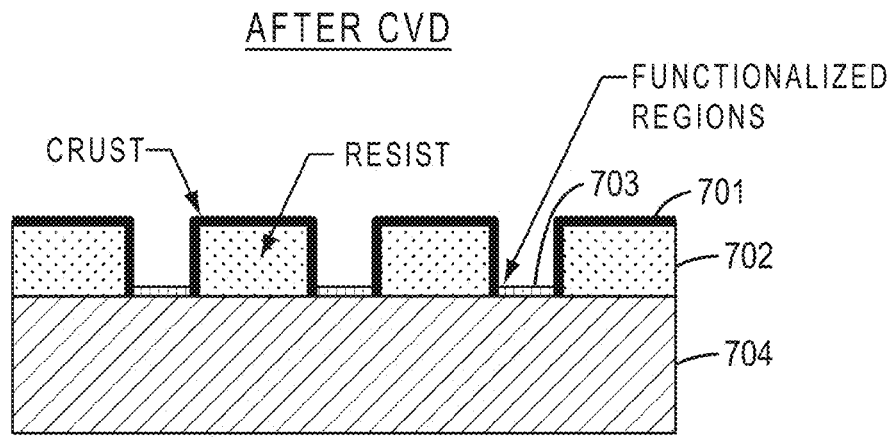
FIG. 7A shows a schematic cross-section of a patterned substrate following organosilane deposition illustrating development of a crust or reacted layer on the surface of a resist following organosilanization.
Figure 7B:
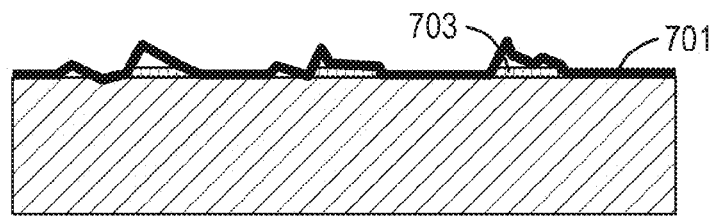
FIG. 7B shows a schematic cross-section of the patterned substrate illustrated in FIG. 7A following stripping the resist in the presence of an organic solvent without ultrasonication.
Figure 8:
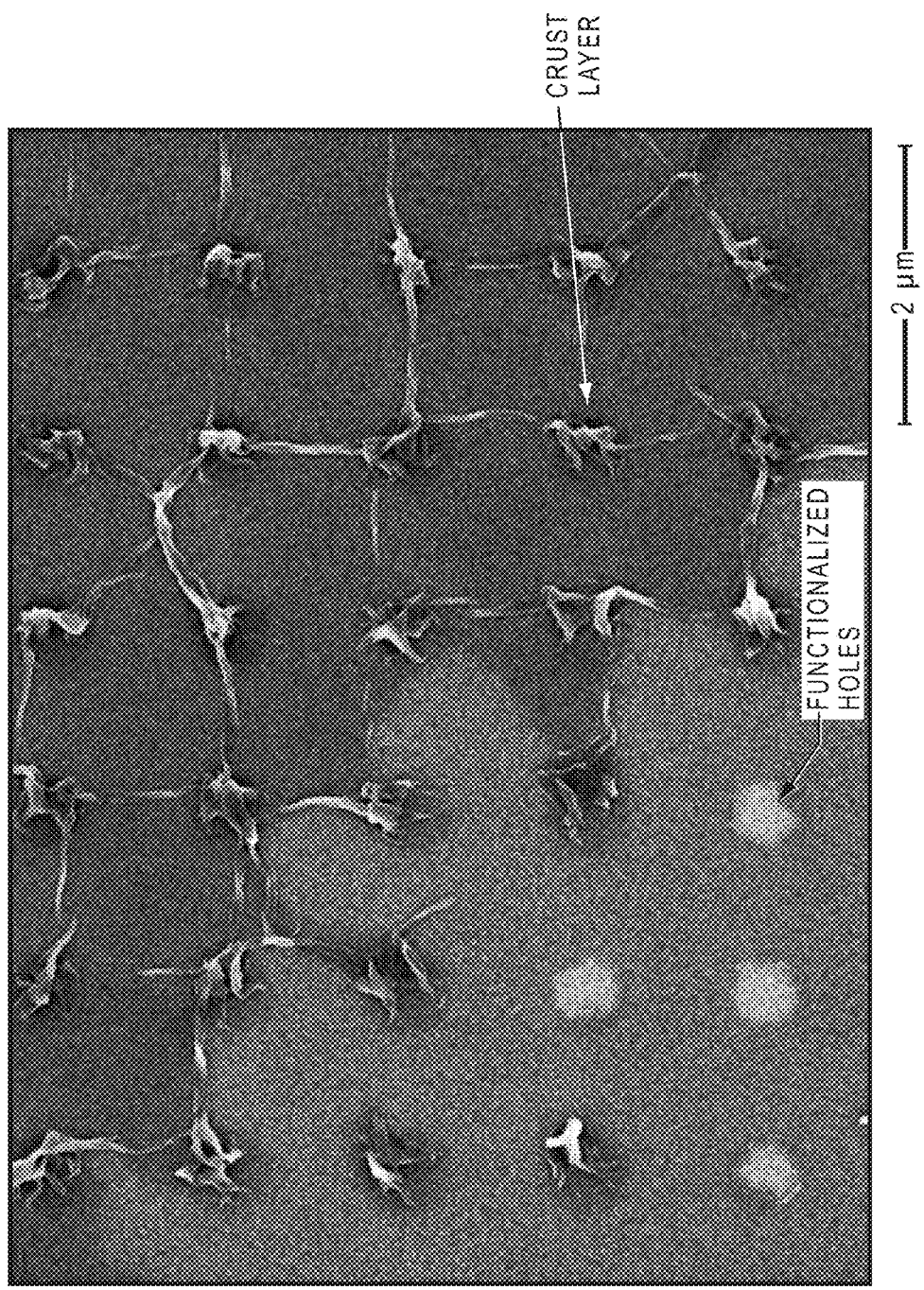
FIG. 8 shows an optical micrograph depicting the surface of a substrate having patterned organosilane-functionalized regions in which the protective coating and the resist were removed without ultrasonication.

There are several important elements to the stripping process. First, to ensure that the underlying organosilane layers are not etched or otherwise chemically damaged, it is useful for the chemicals to be non-oxidizing as is the case for most organic solvents. Second, ultrasonication is useful in breaking up any insoluble crust or reaction layer on the top surface of the resist that forms, as illustrated in FIG. 7A. FIG. 7A shows crust layer 701 formed on resist 702 during functionalization of patterned regions 703 on substrate 704. That such a reaction can occur is not generally known, and the mechanism is not well understood. For the specific case of APTES and APTMS depositions on substrates patterned with a photolithography resist, evidence of the crust can be observed when stripping is performed in the absence of ultrasonication. In these cases, the solvent-insoluble crust layer 701 is observed to collapse onto the surface and crumple onto the patterned functionalized regions 703, as illustrated in FIG. 7B. An electron micrograph illustrating this effect is shown in FIG. 8 where the crust layer has collapsed onto the substrate surface and in particular over the patterned functionalized regions. This of course prevents the substrate from being useful for its intended purpose. It should be noted that resist patterns having high spatial density (~1 μm or less) are particularly vulnerable to this effect due to increased structural stability of the crust layer. Thus, devices intended for use in applications such as high-density DNA sequencing are particularly sensitive to such damage.

Figure 7C:
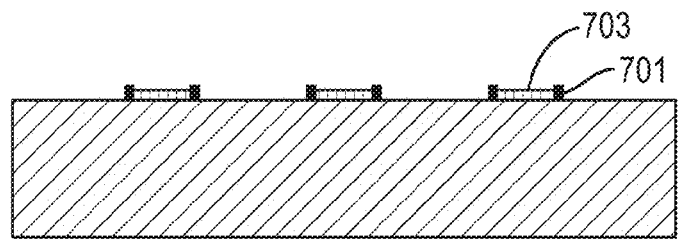
FIG. 7C shows a schematic cross-section of the patterned substrate illustrated in FIG. 7A following stripping the resist in the presence of an organic solvent with ultrasonication.

To prevent this type of damage, application of ultrasonic excitation during the first strip bath is useful. The ultrasonic energy causes cavitation bubbles to form in the solution, and the collapse of the cavities results in localized shock waves adjacent the substrate surface. It is believed that this specific mechanism of energy dissipation causes the crust layer to break off from the base of the patterned resist, leaving only a small remnant of the crust layer 701 at the base of the patterned selectively functionalized regions 703, as shown in FIG. 7C, without affecting the surface functionalization. Use of ultrasonication is not generally applied in resist stripping applications. Using such methods and equipment increases the complexity and cost of such processes and therefore is generally avoided. However, for removing bulk organic films such as resists exposed to organosilanes and in particular for bulk organic films that react with an organosilane to form an insoluble reaction layer or crust, ultrasonication can facilitate removal of the bulk organic film.

Determining the maximum pressure at which reflow of lithographically pattern substrates occurs can be accomplished by performing the organosilane deposition at varying injection pressures and then observing the point at which the morphology of the surface changes. A roughening of the surface is generally exhibited at the onset of reflow. As reflow progresses, the entire resist film becomes liquid and surface tension forces cause the lithographically pattern features to either fill in or to spread out, depending on whether the structures are wells or mesas, respectively. These morphological changes are easily observed by microscopy as shown in FIG. 4 and FIG. 5.

Figure 9:
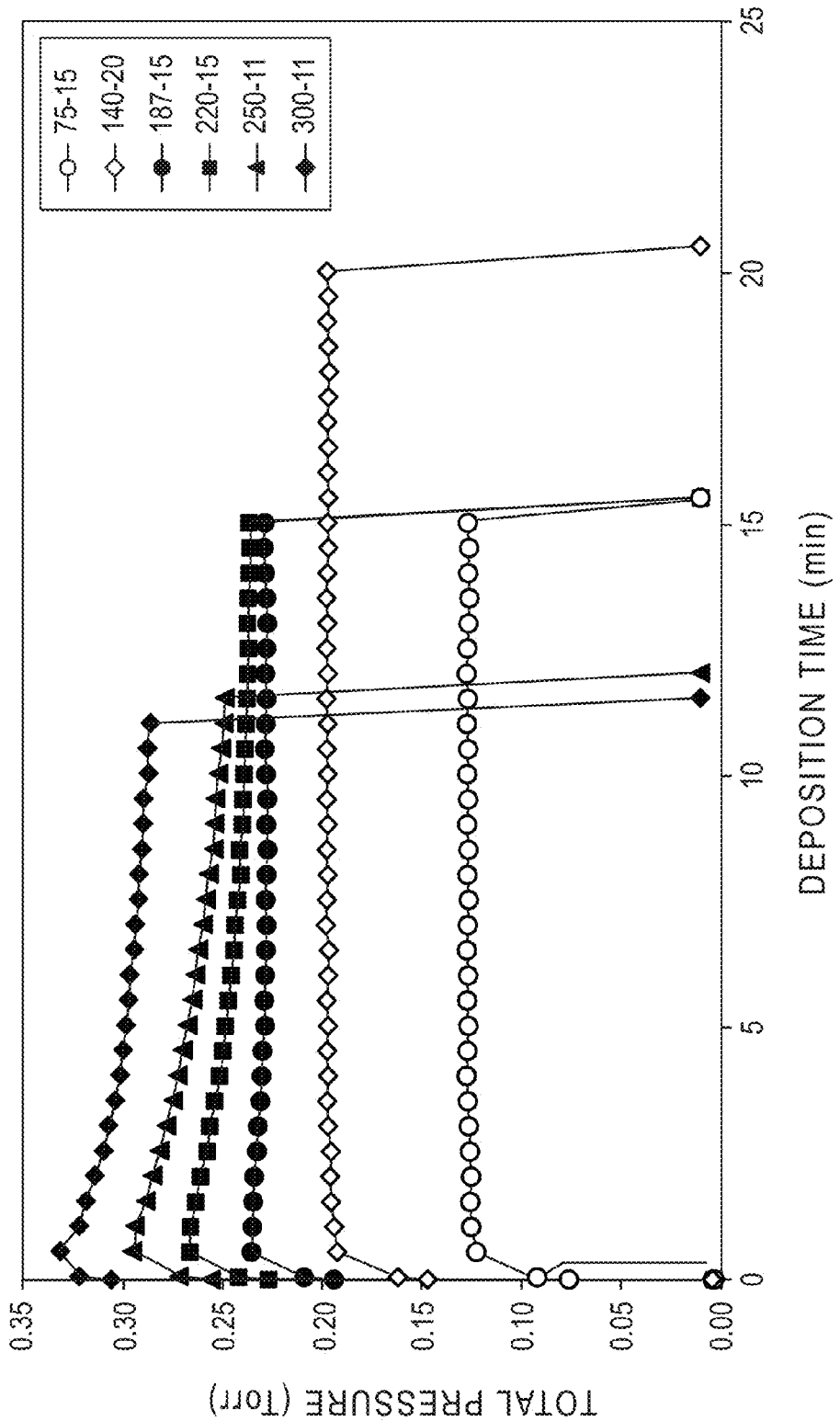
FIG. 9 shows a graph illustrating the change in chamber pressure with time following injection of various pressures of an organosilane vapor.

Another method that can be used to determine the conditions under which reflow occurs is to monitor the chamber pressure directly after injection of the organosilane vapor. In general, the transition to reflow will be accompanied by a significant change in system pressure due to condensation of the organosilane vapor onto the surface of the resist. Changes in pressure may also occur due to increased adsorption of the organosilane vapor or hydrolyzed reactive groups such as methanol or ethanol into the resist. Experimental data for a series of depositions at varying injection pressures and deposition times is shown in FIG. 9. The results shown in FIG. 9 were obtained as follows. A CVD system was loaded with oxidized silicon wafers that had been lithographically patterned with arrays of submicron size contact holes. The wafers were placed in the CVD deposition chamber, which was heated to 45° C., and the system was pumped to a base pressure of about 2 mTorr. Once the base pressure was achieved, the valve to the pump was closed, and APTMS was injected into the chamber by opening a valve to a heated APTMS source. Once the chamber pressure reached a prescribed deposition pressure, e.g., after about 25 sec, the valve to the APTMS source was closed. For practical reasons, this was directly followed by an additional injection of about 60 mTorr of nitrogen through the source lines to clear any residual organosilane gas. The chamber pressure was monitored for a prescribed deposition time, at which point the valve to the pump was opened, thereby causing the chamber pressure to sharply drop and end the organosilane deposition.

FIG. 9 shows the total chamber pressure as a function of time for a series of deposition tests at varying APTMS injection pressures and deposition times. The legend lists the APTMS injection pressure in units of mTorr followed by the deposition time in units of minutes for each test. The results presented in FIG. 9 demonstrate that at an APTMS injection pressure of 140 mTorr and below the total pressure peaks and then remains constant throughout the run. However, for injection pressures of 187 mTorr and above, the total pressure initially peaks and then drops monotonically with time. The results document a transition in behavior between 140 mTorr and 187 mTorr. Inspection of the wafers after each of the deposition runs revealed that above 140 mTorr resist reflow was observed for all test runs with increasing severity the greater the injection pressure. It should also be noted that even though the test at 140 mTorr had approximately the same deposition dose as the test at 250 mTorr (the products of pressure and time were approximately equal), only the 250 mTorr test showed a pressure drop. This demonstrates that a significant driving force behind reflow is the total pressure compared to the deposition dose. Although, the results presented in FIG. 9 and FIG. 10 refer to APTMS functionalization, similar values and trends apply to APTES functionalization.

Figure 10:
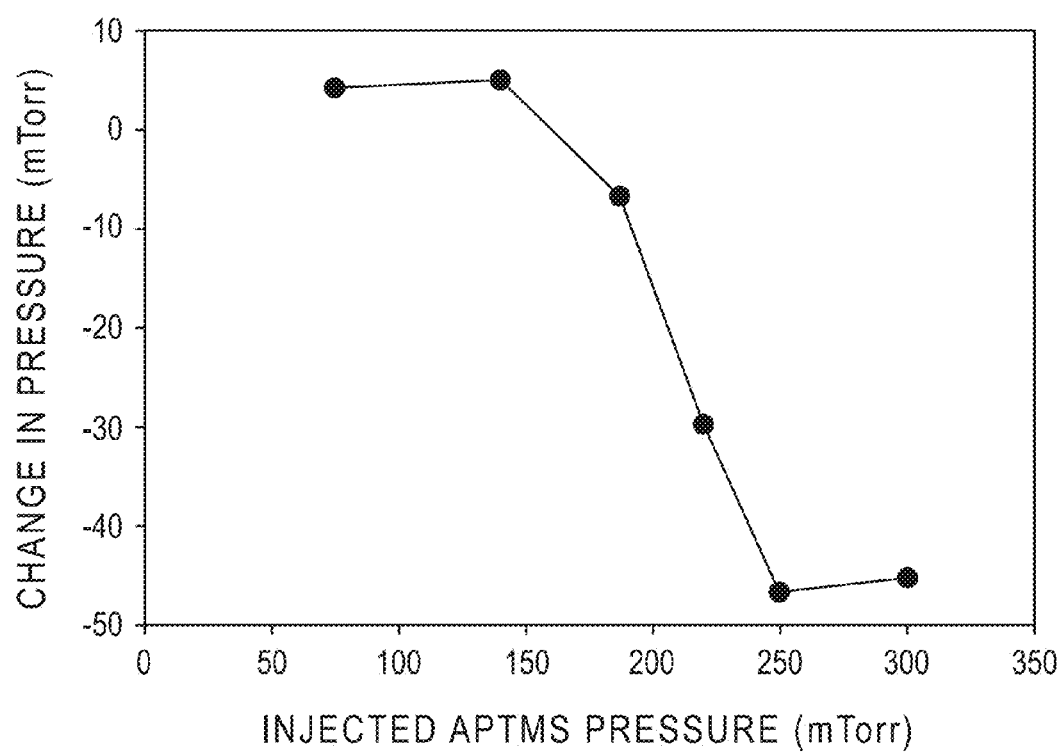
FIG. 10 shows a graph illustrating the relationship between the change in chamber pressure and the pressure of injected organosilane, where the change in pressure refers to the difference between the chamber pressure at 25 sec after injection and the steady state chamber pressure.

The transition in pressure behavior can be seen more clearly by plotting the change in chamber pressure vs. the ATPMS injection pressure, as shown in FIG. 10, where change in chamber pressure refers to the difference in pressure at about 25 sec following injection and the steady-state pressure, e.g., before the end of the test. As shown in FIG. 10, the transition is centered at about 200 mTorr, and it is this value that is identified as being the maximum pressure below which it is desirable to operate the APTMS deposition reaction to avoid the deleterious effects of reflow. In principle, this same methodology can be applied to determine appropriate deposition conditions to avoid reflow when functionalizing a patterned surface using organosilanes other than APTMS.

In summary, several phenomena associated with the organosilane functionalization of patterned substrates and parameters affecting these phenomena are disclosed that were not previously recognized. For example, phenomena include resist reflow above a certain maximum organosilane deposition pressure and the formation of an insoluble crust or reactive layer on a resist caused by the reaction of an organosilane and/or silanization byproducts. Although results have been provided for APTMS, this disclosure having identified several parameters affecting successful organosilane functionalization, one skilled in the art would be able to optimize deposition parameters appropriate for other organosilanes.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

What is claimed is:

1. A method of functionalizing regions of a substrate with an organosilane, wherein the substrate comprises an organic layer and patterned regions of exposed substrate, comprising:
    exposing the substrate to an organosilane vapor at a pressure below a pressure that causes the organic layer to reflow; and using at least a minimum dose of the organosilane vapor sufficient to provide a useful density of functional groups on the patterned regions; wherein,
    the patterned regions have dimensions less than 1 μm; and the minimum dose is at least $1 \times 10^{24}$ molecules per m$^2$.

2. The method of claim 1, wherein the organic layer comprises a resist material.

3. The method of claim 1, wherein the organosilane comprises an aminosilane and the organosilane-functionalized regions comprise aminosilane functional groups.

4. The method of claim 3, wherein the organosilane vapor is selected from aminopropyltrimethoxysilane. aminopropyltriethoxysilane, and a combination thereof.

5. The method of claim 1, wherein the pressure is less than 200 mT.

6. The method of claim 1, wherein the minimum deposition dose is at least $1 \times 10^{25}$ molecules per m$^2$.

7. A method of preparing organosilane-functionalized regions, comprising:
    providing a substrate having a surface;
    depositing a resist on the surface;
    developing selected regions of the resist;
    etching the developed selected regions of the resist to expose selected regions of the substrate; and
    depositing a first organosilane onto the exposed regions to provide organosilane-functionalized regions,
    wherein the depositing is performed using an organosilane vapor at a pressure below a pressure that causes the organic layer to reflow; and using at least a minimum dose of the organosilane vapor sufficient to provide a useful density of functional groups on the patterned regions; wherein,
    the patterned regions have dimensions less than 1 μm; and the minimum dose is at least $1 \times 10^{24}$ molecules per m$^2$.

8. The method of claim 7, comprising, before the step of depositing a resist on the surface, depositing a second organosilane on the substrate surface to provide an organosilane-functionalized film on the substrate surface; and depositing a resist comprises depositing a resist on the organosilane-functionalized film.

9. The method of claim 8, wherein the organosilane-functionalized film comprises terminal methyl groups.

10. The method of claim 7, wherein the first organosilane comprises an aminosilane.

11. The method of claim 10, wherein the aminosilane is selected from aminopropyltrimethoxysilane, aminopropyltriethoxysilane, and a combination thereof.

12. The method of claim 7, wherein the organosilane-functionalized regions comprise a functionalized monolayer.

13. The method of claim 7, wherein the organosilane vapor comprises aminopropyltrimethoxysilane and the pressure is less than 200 mT.

14. The method of claim 7, wherein the organosilane vapor comprises aminopropyltrimethoxysilane and the minimum deposition dose is at least $1 \times 10^{25}$ molecules per m$^2$.

15. The method of claim 7, comprising stabilizing the organosilane-functionalized regions.

16. The method of claim 7, comprising stripping the resist in a non-oxidizing solvent with ultrasonic excitation.

17. The method of claim 7, wherein stripping the resist comprises moving or rotating the substrate.

18. A method of preparing functionalized regions, comprising:
   providing a silicon substrate having a surface;
   oxidizing the surface of the silicon substrate to provide an oxidized silicon surface;
   functionalizing the oxidized silicon surface with a monolayer of terminal methyl groups;
   depositing a resist on the methyl-functionalized surface;
   developing selected regions of the resist, wherein the selected regions have dimensions less than 1 μm;
   etching the developed selected regions of the resist to expose selected regions of the substrate; and
   exposing the selected regions to an aminosilane vapor to provide a monolayer having terminal amine groups, wherein the aminosilane vapor has a pressure less than a pressure that causes the organic layer to reflow, and the exposing uses at least a minimum dose of the organosilane vapor sufficient to provide a useful density of terminal amine groups on the selected regions, wherein the minimum deposition dose is at least $1\times10^{24}$ molecules per $m^2$;
   stabilizing the monolayer having terminal amine groups; and
   exposing the resist to a non-oxidizing solvent with ultrasonic excitation to strip the resist.

19. The method of claim 18, wherein the pressure is less than 200 mT.

* * * * *